US010230913B2

(12) United States Patent
Nishino

(10) Patent No.: US 10,230,913 B2
(45) Date of Patent: Mar. 12, 2019

(54) TRANSMITTER AND COMMUNICATION SYSTEM

(71) Applicant: SONY CORPORATION, Tokyo (JP)

(72) Inventor: Riichi Nishino, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 110 days.

(21) Appl. No.: 15/316,903

(22) PCT Filed: Jun. 2, 2015

(86) PCT No.: PCT/JP2015/065841
§ 371 (c)(1),
(2) Date: Dec. 7, 2016

(87) PCT Pub. No.: WO2015/198804
PCT Pub. Date: Dec. 30, 2015

(65) Prior Publication Data
US 2017/0104947 A1 Apr. 13, 2017

(30) Foreign Application Priority Data
Jun. 26, 2014 (JP) ................................ 2014-131605

(51) Int. Cl.
*H04N 5/374* (2011.01)
*H04L 25/02* (2006.01)
(Continued)

(52) U.S. Cl.
CPC ........... *H04N 5/374* (2013.01); *H03K 17/063* (2013.01); *H03K 19/018507* (2013.01);
(Continued)

(58) Field of Classification Search
CPC ...... H04N 5/374; H04N 5/378; H04N 5/3698; H04B 1/04; H03K 17/063
See application file for complete search history.

(56) References Cited

U.S. PATENT DOCUMENTS 4,021,751 A * 5/1977 Suzuki .................... H01L 29/00
257/E29.001
5,204,557 A * 4/1993 Nguyen ........... H03K 3/356017
326/17

(Continued)

FOREIGN PATENT DOCUMENTS

JP 58-195888 A 11/1983
JP 60-189322 A 9/1985
(Continued)

*Primary Examiner* — Timothy J Henn
(74) *Attorney, Agent, or Firm* — Chip Law Group

(57) ABSTRACT

A transmitter according to the disclosure includes a driver, a first pre-driver, a second pre-driver, and a power-supply-voltage generator. The driver includes a first transistor and a second transistor. The first transistor has a drain supplied with a first power supply voltage, a source led to an output terminal, and a gate. The second transistor has a drain led to the output terminal, a grounded source, and a gate. The first pre-driver is supplied with a second power supply voltage and drives the gate of the first transistor. The second power supply voltage has a positive correlation with the first power supply voltage. The second pre-driver is supplied with a third power supply voltage and drives the gate of the second transistor. The power-supply-voltage generator generates the first power supply voltage, the second power supply voltage, and the third power supply voltage.

14 Claims, 13 Drawing Sheets

(51) Int. Cl.
  *H03K 17/06* (2006.01)
  *H04B 1/04* (2006.01)
  *H04N 5/369* (2011.01)
  *H04N 5/378* (2011.01)
  *H03K 19/0185* (2006.01)

(52) U.S. Cl.
  CPC .............. *H03K 19/018557* (2013.01); *H03K 19/018585* (2013.01); *H04B 1/04* (2013.01); *H04L 25/02* (2013.01); *H04N 5/3698* (2013.01); *H04N 5/378* (2013.01)

(56) References Cited

U.S. PATENT DOCUMENTS

| | | | | |
|---|---|---|---|---|
| 5,959,475 | A * | 9/1999 | Zomorrodi | H03F 3/301 327/112 |
| 7,271,630 | B2 * | 9/2007 | Su | H03F 3/26 326/87 |
| 7,348,848 | B2 * | 3/2008 | Huang | H03F 3/45183 330/253 |
| 7,948,278 | B2 * | 5/2011 | Hasegawa | H03K 19/017 327/108 |
| 8,022,730 | B2 * | 9/2011 | Huang | H03K 5/023 326/62 |
| 9,214,942 | B2 * | 12/2015 | Thakur | H03K 19/0948 |
| 2003/0034799 | A1 * | 2/2003 | Chang | H03K 19/018585 326/57 |
| 2010/0164544 | A1 * | 7/2010 | Song | H03K 19/018521 326/80 |
| 2012/0044398 | A1 * | 2/2012 | Chou | H04N 5/3577 348/308 |
| 2012/0188016 | A1 * | 7/2012 | Hunt | H03F 1/308 330/269 |
| 2016/0164515 | A1 * | 6/2016 | Goel | H03K 17/165 327/434 |

FOREIGN PATENT DOCUMENTS

| | | |
|---|---|---|
| JP | 04-249945 A | 9/1992 |
| JP | 08-249879 A | 9/1996 |
| JP | 2002-359548 A | 12/2002 |
| JP | 2013-150182 A | 8/2013 |

\* cited by examiner

[FIG. 1]
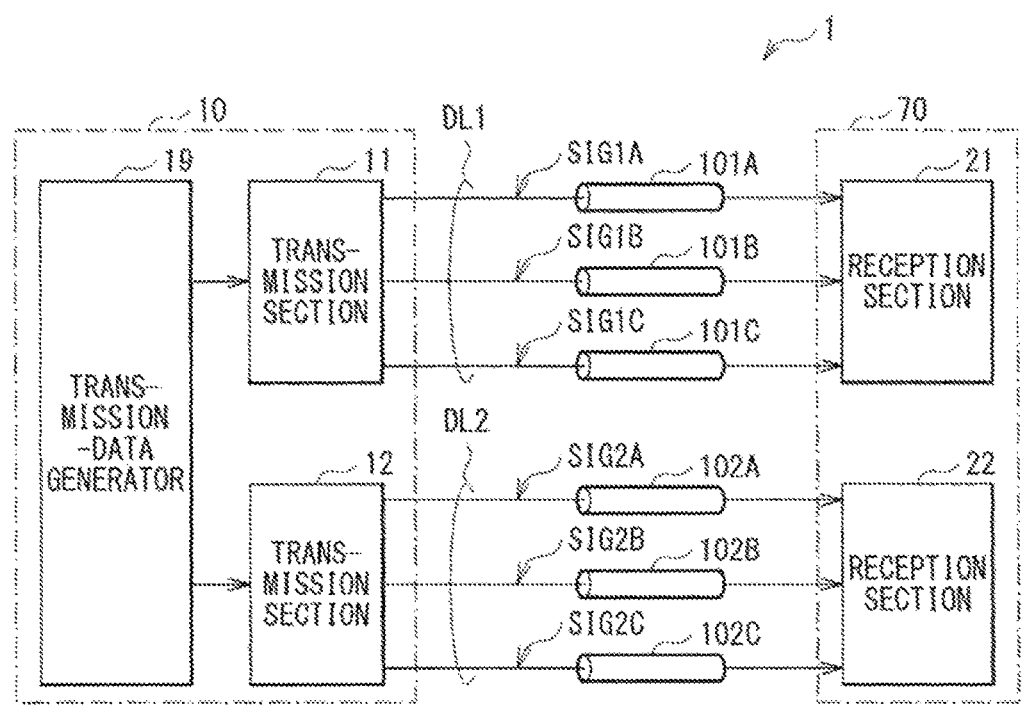

[FIG. 2]
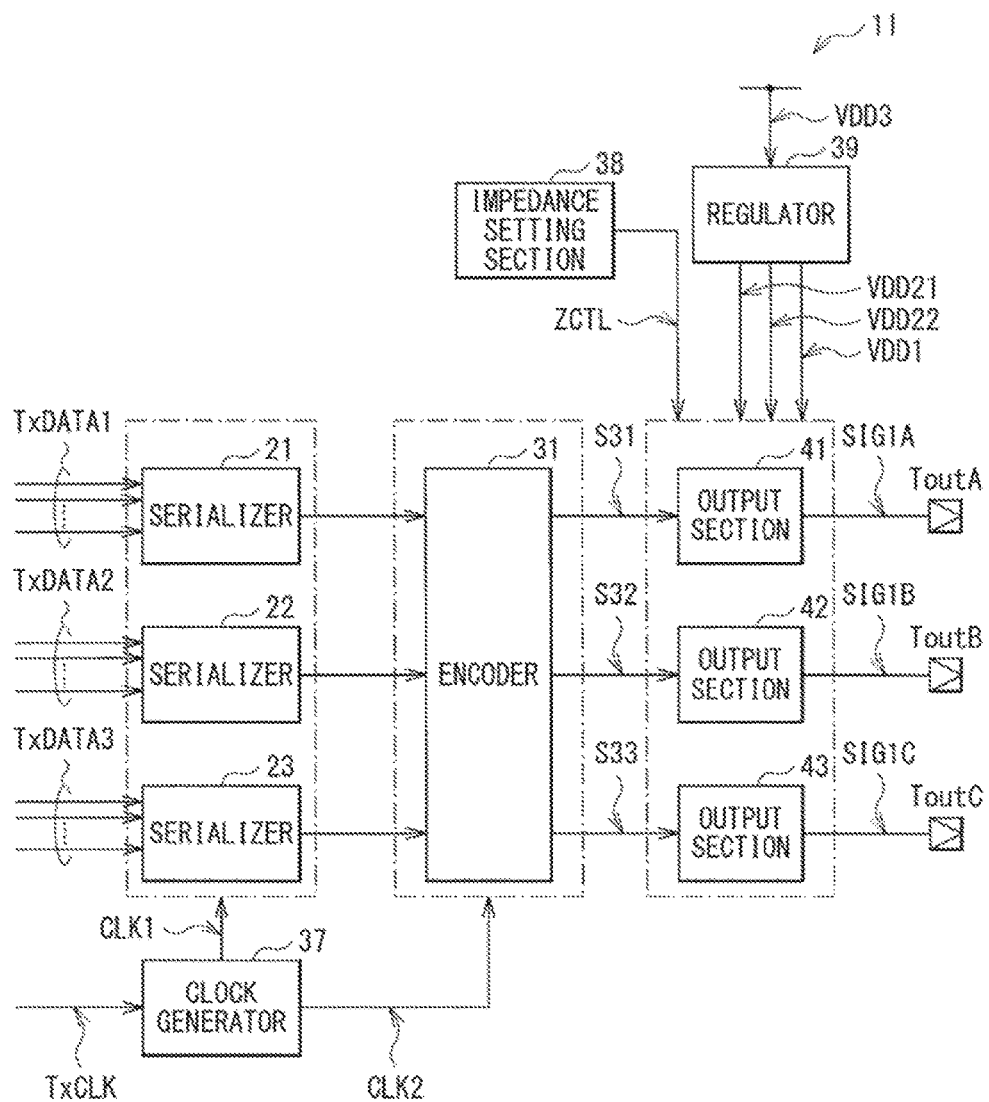

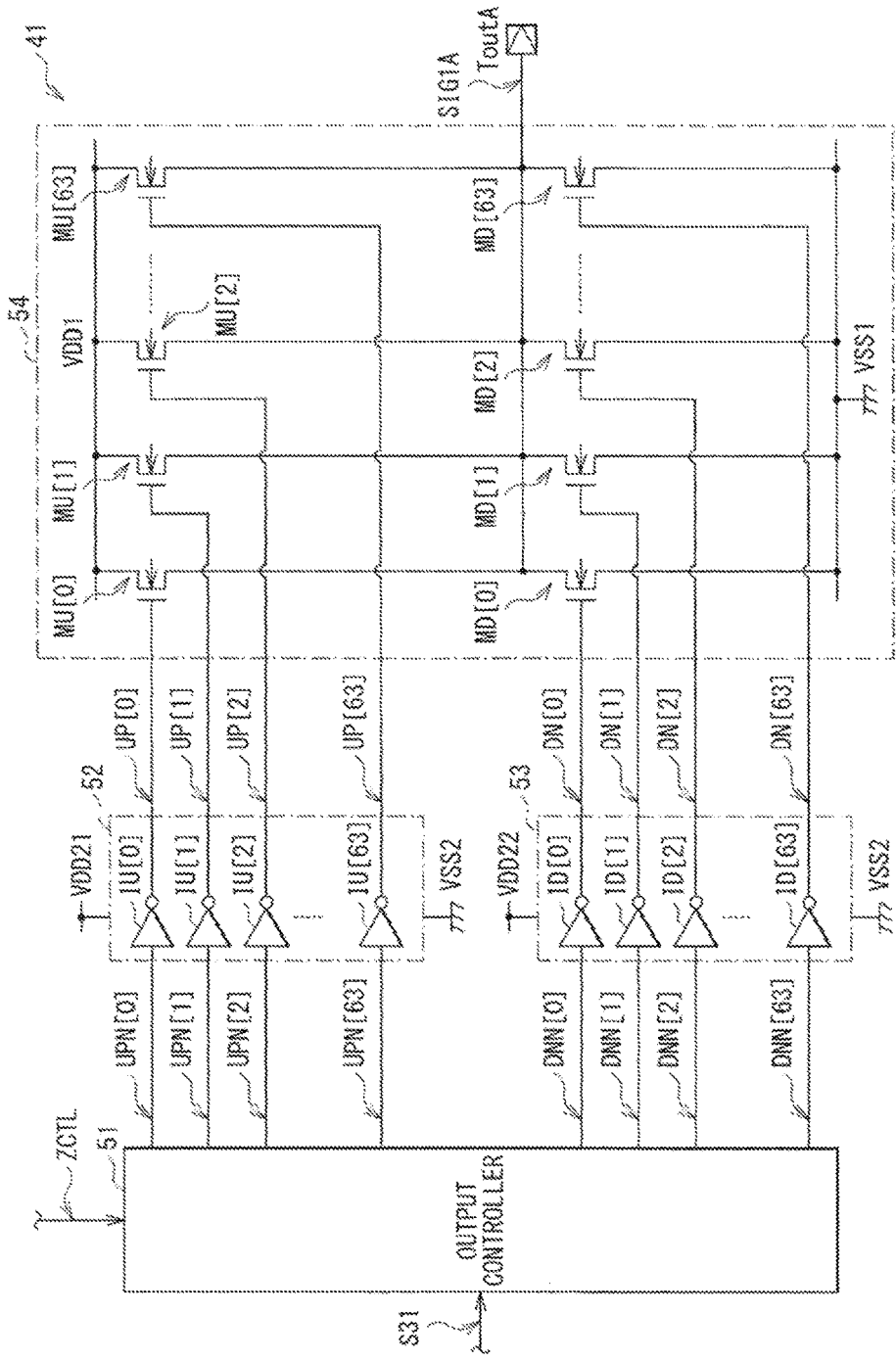
[FIG. 3]

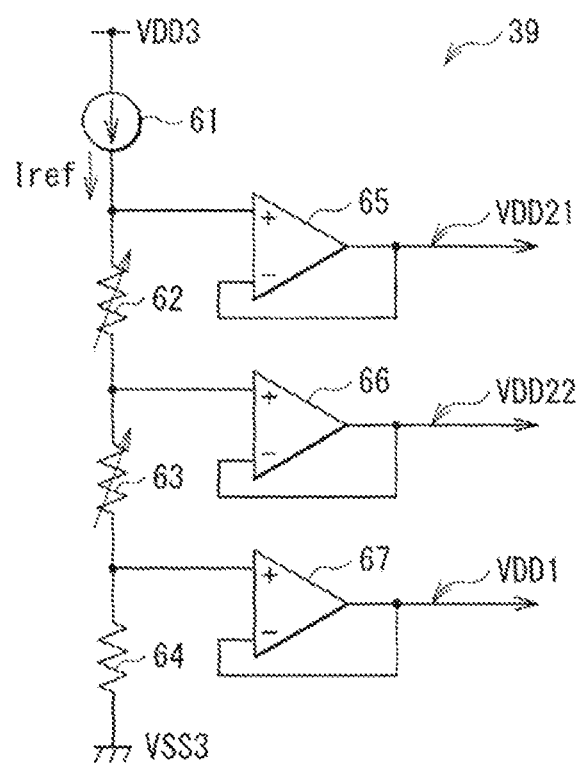
[FIG. 4]

[ FIG. 5 ]
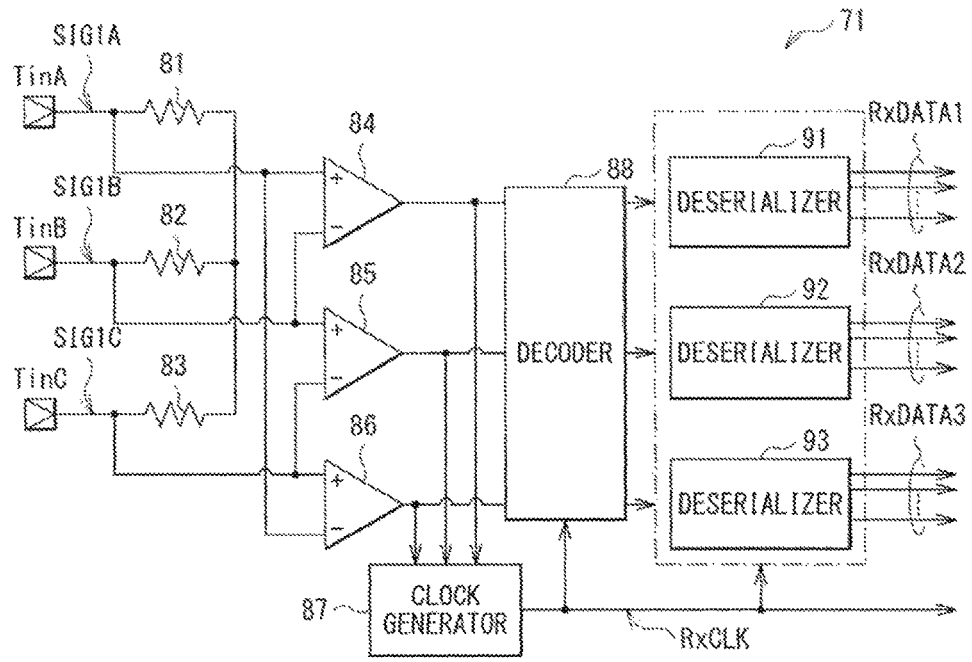
[ FIG. 6 ]
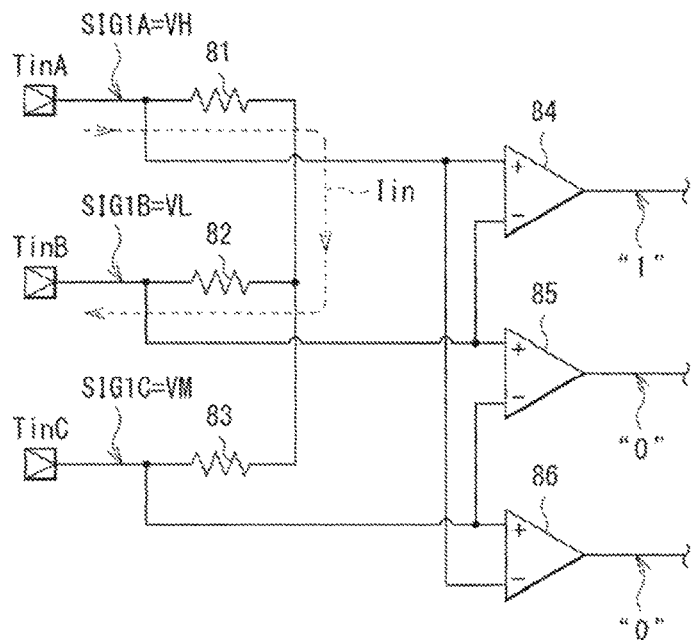

[FIG. 7]
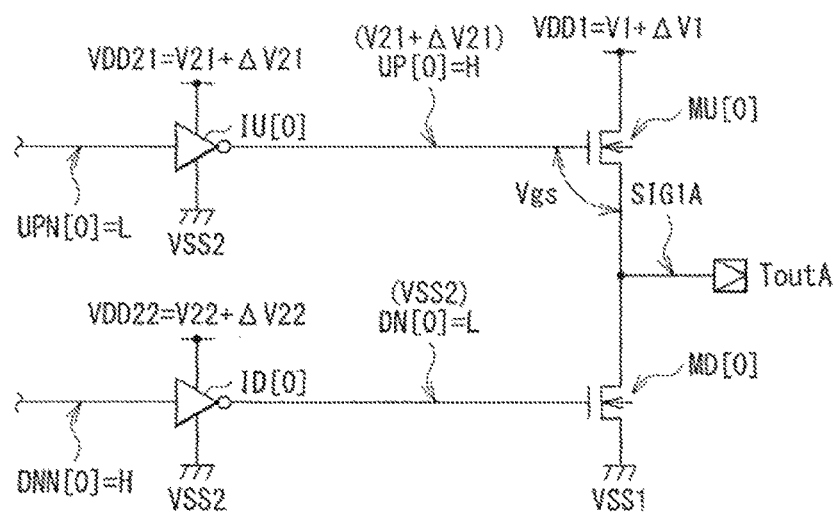
[FIG. 8]
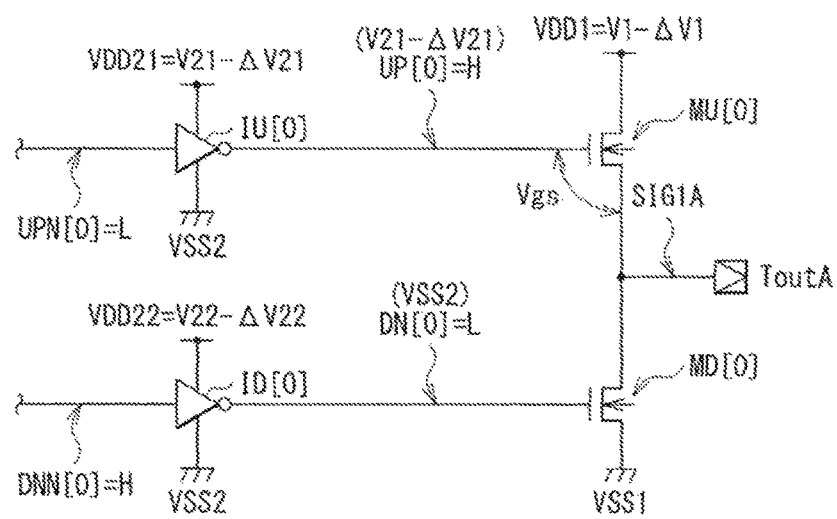

[FIG. 9]
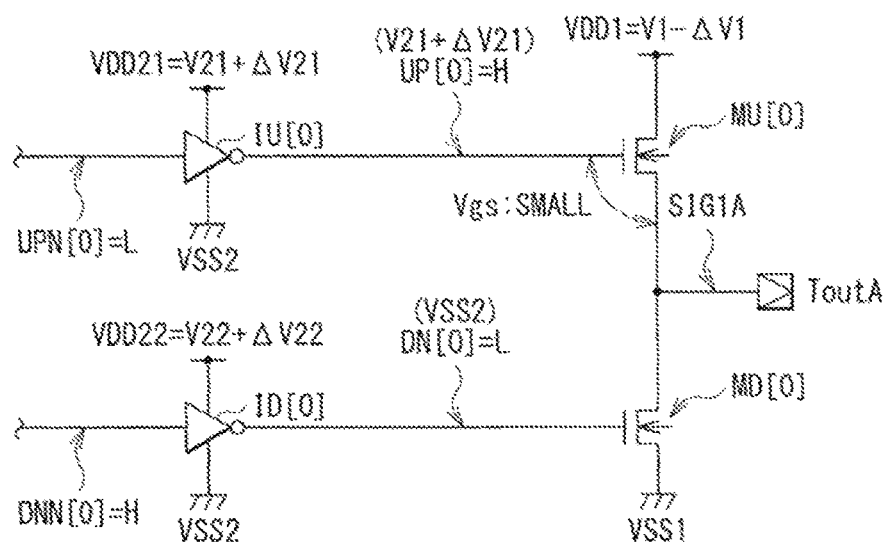

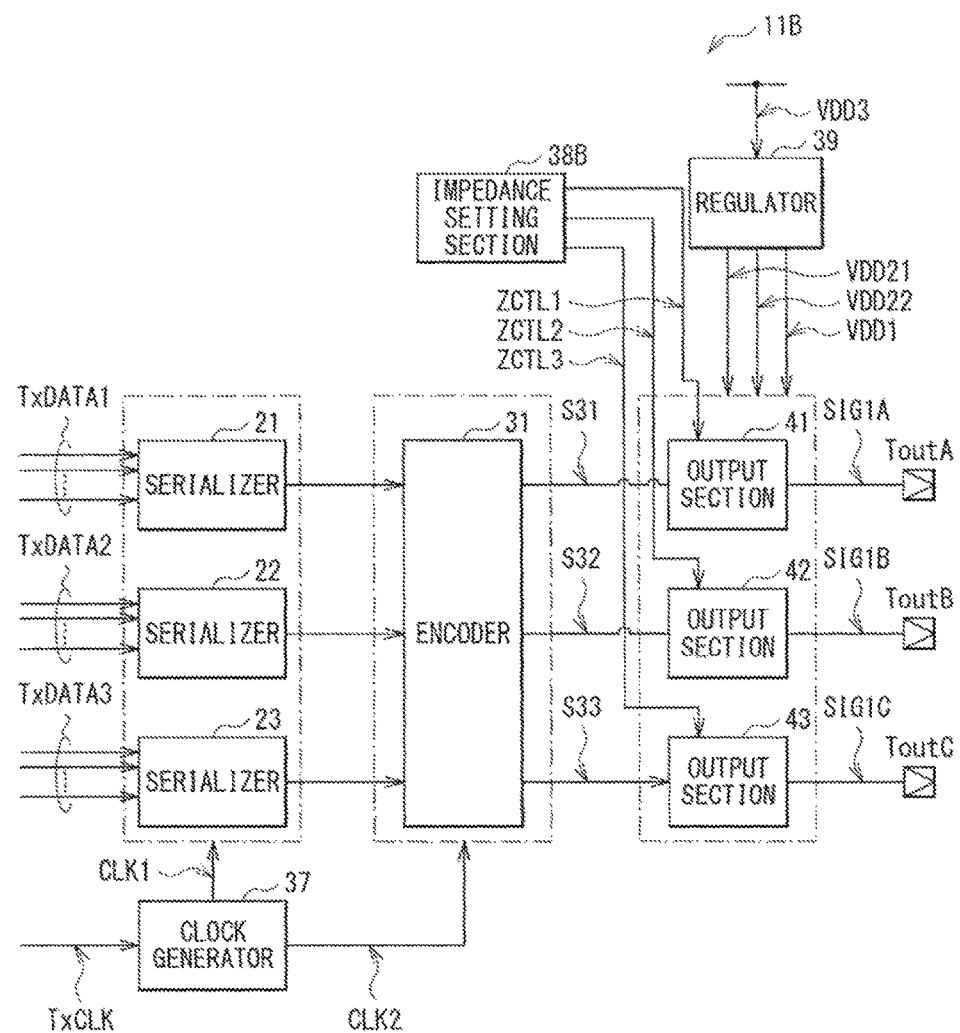
[FIG. 10]

[FIG. 11]
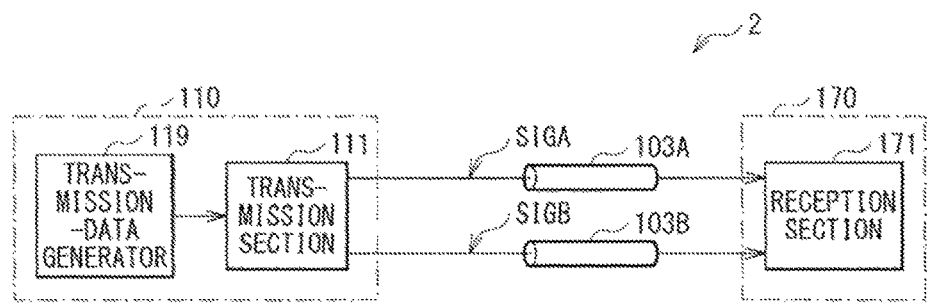
[FIG. 12]
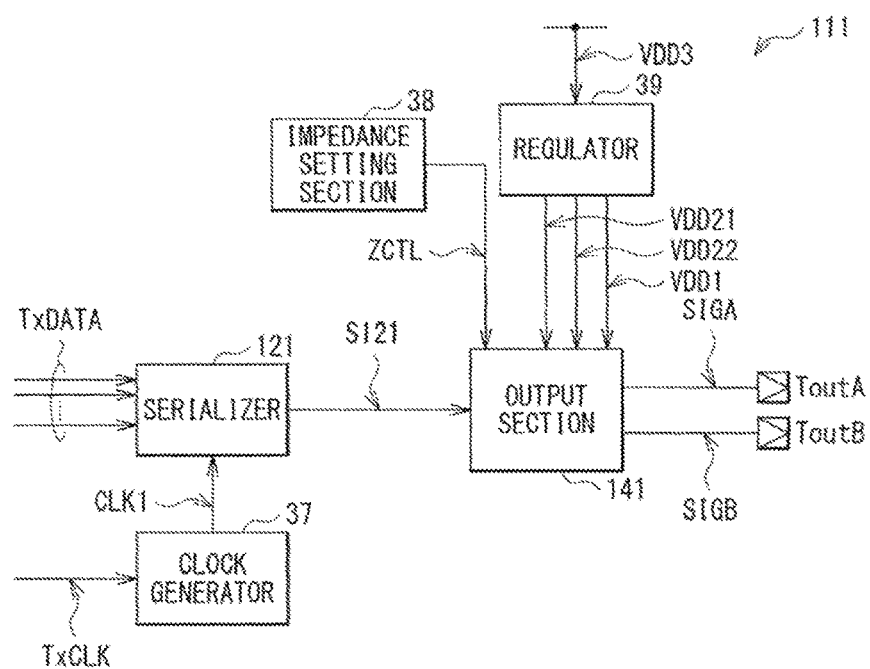

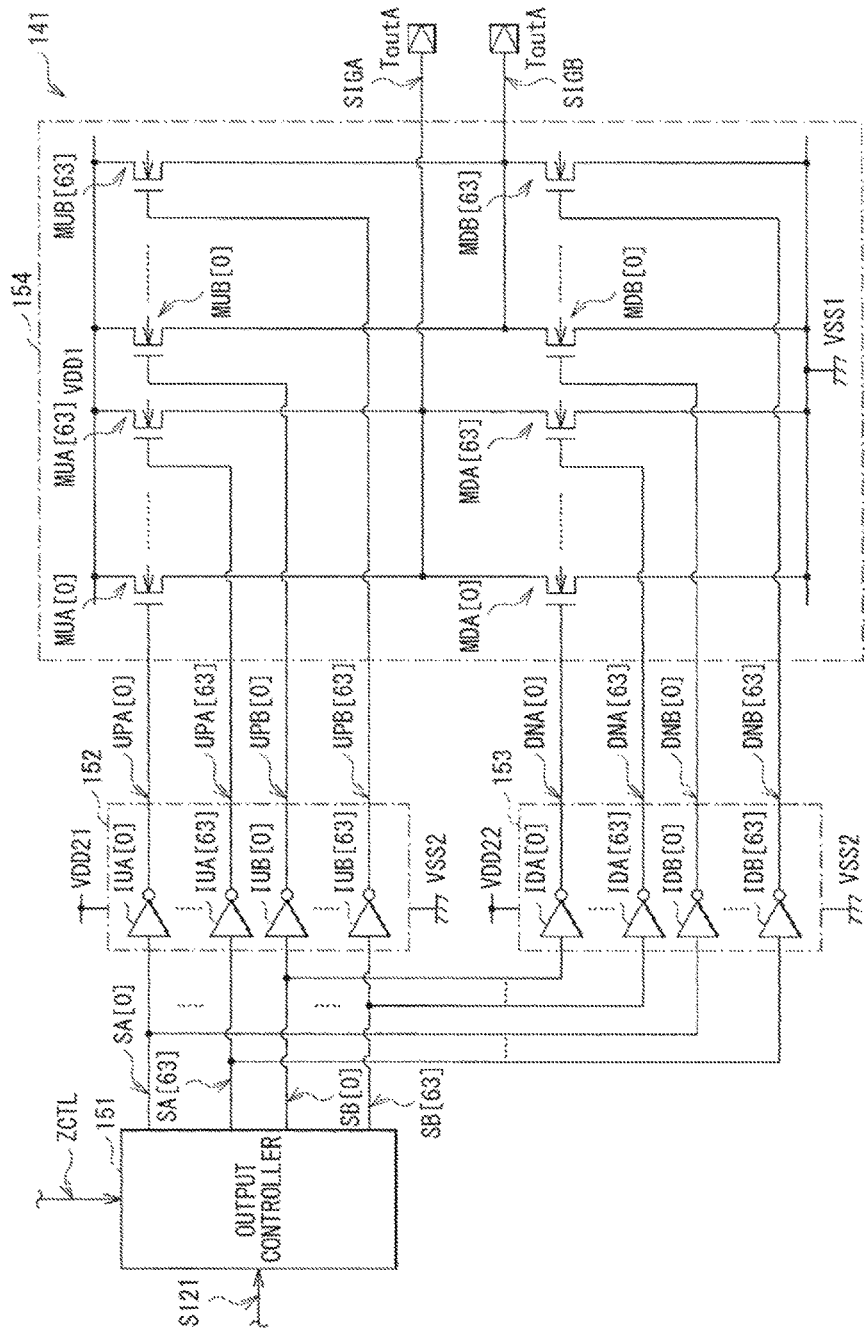
[ FIG. 13 ]

[FIG. 14]
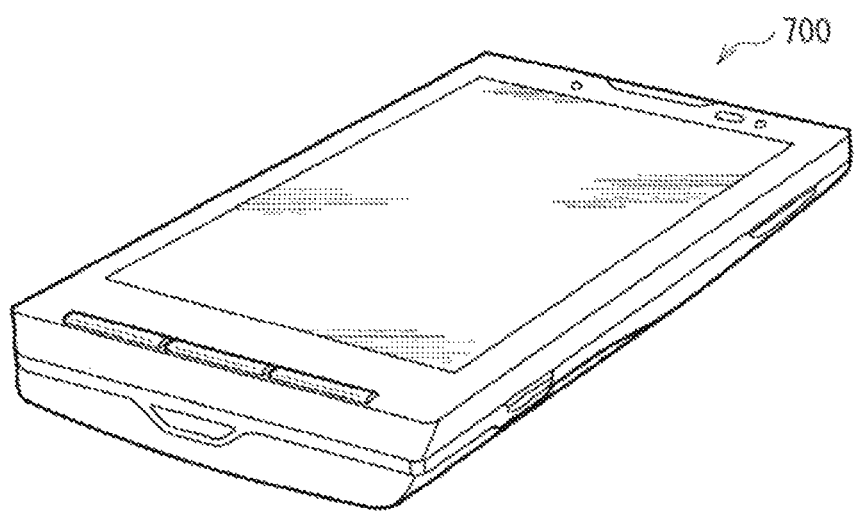

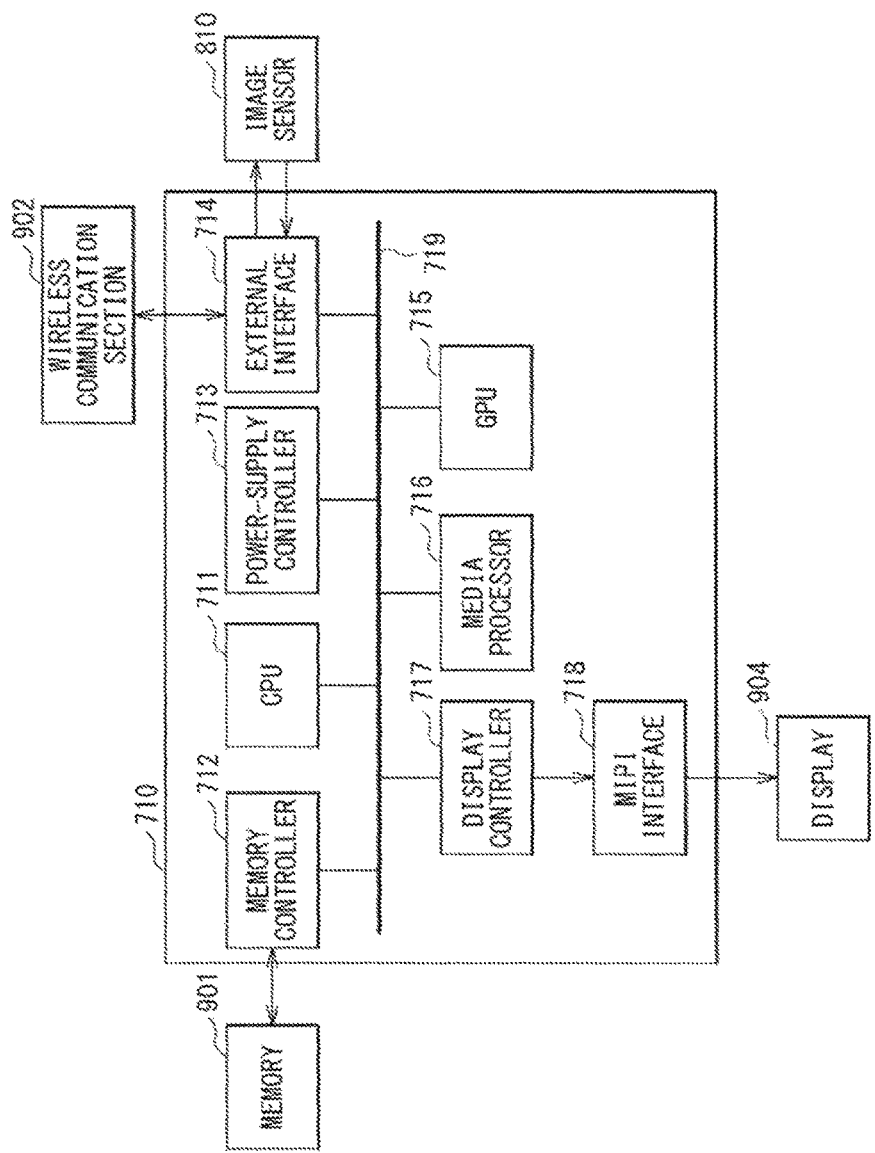
[FIG. 15]

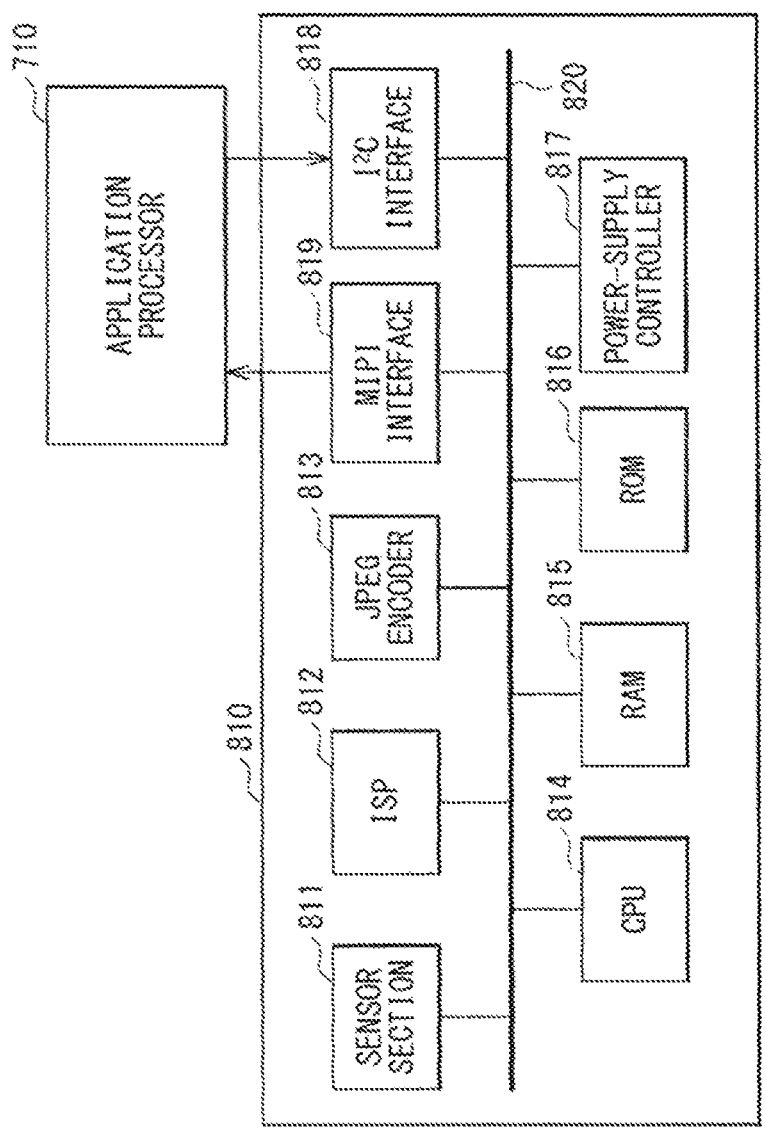
[ FIG. 16 ]

TRANSMITTER AND COMMUNICATION SYSTEM

CROSS REFERENCE TO RELATED APPLICATIONS

This application is a U.S. National Phase of International Patent Application No. PCT/JP2015/065841 filed on Jun. 2, 2015, which claims priority benefit of Japanese Patent Application No. JP 2014-131605 filed in the Japan Patent Office on Jun. 26, 2014. Each of the above-referenced applications is hereby incorporated herein by reference in its entirety.

TECHNICAL FIELD

The present disclosure relates to a transmitter that transmits a signal, and a communication system with such a transmitter.

BACKGROUND ART

With high functionality and multifunctionality of electronic apparatuses in recent years, the electronic apparatuses have been equipped with various devices such as a semiconductor chip, a sensor, and a display device. These devices exchange a large amount of data, and the amount of data has increased with the high functionality and the multifunctionality of the electronic apparatuses.

Related to communication systems used for such exchange of data, various technologies are disclosed. For example, PTL 1 discloses a transmitter in which a driver is configured using a push pull circuit having two N-channel MOS (Metal Oxide Semiconductor) FETs (Field Effect Transistors).

CITATION LIST

Patent Literature

PTL 1: Japanese Unexamined Patent Application Publication No. H04-249945

SUMMARY OF THE INVENTION

Incidentally, in general, in a communication system, high communication performance is desired, and a further improvement in communication performance is expected.

Therefore, it is desirable to provide a transmitter and a communication system that make it possible to enhance communication performance.

A transmitter according to one embodiment of the disclosure includes a driver, a first pre-driver, a second pre-driver, and a power-supply-voltage generator. The driver includes a first transistor and a second transistor. The first transistor has a drain supplied with a first power supply voltage, a source led to an output terminal, and a gate. The second transistor has a drain led to the output terminal, a grounded source, and a gate. The first pre-driver is supplied with a second power supply voltage and drives the gate of the first transistor. The second power supply voltage has a positive correlation with the first power supply voltage. The second pre-driver is supplied with a third power supply voltage and drives the gate of the second transistor. The power-supply-voltage generator generates the first power supply voltage, the second power supply voltage, and the third power supply voltage.

A communication system according to one embodiment of the disclosure includes a transmitter and a receiver. The transmitter includes a driver, a first pre-driver, a second pre-driver, and a power-supply-voltage generator. The driver includes a first transistor and a second transistor. The first transistor has a drain supplied with a first power supply voltage, a source led to an output terminal, and a gate. The second transistor has a drain led to the output terminal, a grounded source, and a gate. The first pre-driver is supplied with a second power supply voltage and drives the gate of the first transistor. The second power supply voltage has a positive correlation with the first power supply voltage. The second pre-driver is supplied with a third power supply voltage and drives the gate of the second transistor. The power-supply-voltage generator generates the first power supply voltage, the second power supply voltage, and the third power supply voltage.

In the transmitter and the communication system according to the respective embodiments of the disclosure, the first transistor of the driver is driven by the first pre-driver, and the second transistor of the driver is driven by the second pre-driver. At the time, the first power supply voltage supplied to the driver has the positive correlation with the second power supply voltage supplied to the first pre-driver.

According to the transmitter and the communication system of the respective embodiments of the disclosure, the first power supply voltage and the second power supply voltage have the positive correlation with each other, and it is therefore possible to enhance communication performance. It is to be noted that the effect described herein is not necessarily limitative, and any of effects described in the disclosure may be provided.

BRIEF DESCRIPTION OF THE DRAWINGS

FIG. 1 is a block diagram illustrating a configuration example of a communication system according to an embodiment of the disclosure.

FIG. 2 is a block diagram illustrating a configuration example of a transmission section illustrated in FIG. 1.

FIG. 3 is a circuit diagram illustrating a configuration example of an output section illustrated in FIG. 2.

FIG. 4 is a circuit diagram illustrating a configuration example of a regulator illustrated in FIG. 2.

FIG. 5 is a block diagram illustrating a configuration example of a reception section illustrated in FIG. 1.

FIG. 6 is an explanatory diagram illustrating an operation example of the reception section illustrated in FIG. 5.

FIG. 7 is an explanatory diagram illustrating an operation example of the output section illustrated in FIG. 3.

FIG. 8 is an explanatory diagram illustrating another operation example of the output section illustrated in FIG. 3.

FIG. 9 is an explanatory diagram illustrating an operation example of an output section according to a comparative example.

FIG. 10 is a block diagram illustrating a configuration example of a transmission section according to one modification.

FIG. 11 is a block diagram illustrating a configuration example of a communication system according to one modification.

FIG. 12 is a block diagram illustrating a configuration example of the transmission section illustrated in FIG. 11.

FIG. 13 is a circuit diagram illustrating a configuration example of an output section illustrated in FIG. 12.

FIG. 14 is a perspective view illustrating an appearance configuration of a smartphone to which a transmitter according to the embodiment is applied.

FIG. 15 is a block diagram illustrating a configuration example of an application processor to which the transmitter according to the embodiment is applied.

FIG. 16 is a block diagram illustrating a configuration example of an image sensor to which the transmitter according to the embodiment is applied.

MODES FOR CARRYING OUT THE INVENTION

Some embodiments of the disclosure will be described below in detail with reference to the drawings. It is to be noted that the description will be provided in the following order.
1. Embodiment
2. Application Example
<1. Embodiment>
[Configuration Example]

FIG. 1 illustrates a configuration example of a communication system to which a transmitter according to an embodiment is applied. A communication system 1 may perform exchange of data using three voltages. The communication system 1 includes a transmitter 10 and a receiver 70.

The transmitter 10 may include a transmission-data generator 19, and transmission sections 11 and 12. The transmission-data generator 19 generates transmission data, divides the generated transmission data into two pieces, and supplies the two pieces of the transmission data to the respective transmission sections 11 and 12. The transmission section 11 transmits data to the receiver 70 through a data lane DL1, and the transmission section 12 transmits data to the receiver 70 through a data lane DL2. Specifically, the transmission section 11 transmits the data to the receiver 70 using three signals SIG1A, SIG1B, and SIG1C, and the transmission section 12 transmits the data to the receiver 70 using three signals SIG2A, SIG2B, and SIG2C. Characteristic impedance of each of transmission lines 101A to 101C and 102A to 102C, through which these signals are transmitted, may be about 50[Ω], in this example.

FIG. 2 illustrates a configuration example of the transmission section 11. It is to be noted that the transmission section 12 has a similar configuration. The transmission section 11 may include serializers 21 to 23, an encoder 31, a clock generator 37, output sections 41 to 43, an impedance setting section 38, and a regulator 39.

The serializer 21 converts a parallel signal TxDATA1 into a serial signal on the basis of a clock signal CLK1, the serializer 22 converts a parallel signal TxDATA2 into a serial signal on the basis of the clock signal CLK1, and the serializer 23 converts a parallel signal TxDATA3 into a serial signal on the basis of the clock signal CLK1.

The encoder 31 performs predetermined encoding on the basis of the signals supplied from the serializers 21, 22, and 23, and a clock signal CLK2, thereby generating signals S31, S32, and S33. As will be described later, the signal S31 is a signal for providing an instruction to the output section 41, as to which one of the three voltages (a high-level voltage VH, an intermediate-level voltage VM, and a low-level voltage VL) is a voltage at which a voltage of an output terminal ToutA is to be set. Similarly, the signal S32 is a signal for providing an instruction to the output section 42, as to which one of the three voltages is a voltage at which a voltage of an output terminal ToutB is to be set, and the signal S33 is a signal for providing an instruction to the output section 43, as to which one of the three voltages is a voltage at which a voltage of an output terminal ToutC is to be set. The encoder 31 generates, at the time, the signals S31, S32, and S33, in such a manner that the voltage of the output terminal ToutA, the voltage of the output terminal ToutB, and the voltage of the output terminal ToutC are different from each other.

The clock generator 37 generates the clock signals CLK1 and CLK2 on the basis of a clock signal TxCLK. The clock generator 37 may be configured using, for example, a PLL (Phase Locked Loop).

The output section 41 generates the signal SIG1A on the basis of the signal S31, the output section 42 generates the signal SIG1B on the basis of the signal S32, and the output section 43 generates the signal SIG1C on the basis of the signal S33. The respective output sections 41 to 43 are supplied with power supply voltages VDD21, VDD22, and VDD1 from the regulator 39. In this example, the power supply voltage VDD21 is higher than the power supply voltage VDD22, and the power supply voltage VDD22 is higher than the power supply voltage VDD1. Further, each of the output sections 41 to 43 also have a function of adjusting output impedance on the basis of a control signal ZCTL as will be described later.

FIG. 3 illustrates a configuration example of the output section 41. The output sections 42 and 43 each also have a similar configuration. The output section 41 may include an output controller 51, pre-driver sections 52 and 53, and a driver 54.

The output controller 51 generates signals UPN[0] to UPN[63] and DNN[0] to DNN[63] on the basis of the signal S31 and the control signal ZCTL. In the following, the term the "signal UPN" will be used where appropriate to refer to any one of the signals UPN[0] to UPN[63], and likewise, the term the "signal DNN" will be used where appropriate to refer to any one of the signals DNN[0] to DNN[63].

The pre-driver 52 generates signals UP[0] to UP[63] on the basis of the signals UPN[0] to UPN[63]. This pre-driver 52 may include inverters IU[0] to IU[63]. The inverter IU[0] inverts the signal UPN[0], thereby generating the signal UP[0]. The inverter IU[1] inverts the signal UPN[1], thereby generating the signal UP[1], and the inverter IU[2] inverts the signal UPN[2], thereby generating signal UP[2]. The respective inverters IU[3] to IU[6] operate similarly. The pre-driver 52 is supplied with the power supply voltage VDD21 and a ground voltage VSS2. The power supply voltage VDD21 is supplied from the regulator 39, and the ground voltage VSS2 may be supplied, for example, from outside of the transmitter 10. The signals UP[0] to UP[63] each make a transition between the power supply voltage VDD21 and the ground voltage VSS2.

The pre-driver 53 generates signals DN[0] to DN[63] on the basis of the signals DNN[0] to DNN[63]. This pre-driver 53 may include inverters ID[0] to ID[63]. The inverter ID[0] inverts the signal DNN[0], thereby generating the signal DN[0]. The inverter ID[1] inverts the signal DNN[1], thereby generating the signal DN[1], and the inverter ID[2] inverts the signal DNN[2], thereby generating the signal DN[2]. The respective inverters ID[3] to ID[6] operate similarly. The pre-driver 53 is supplied with the power supply voltage VDD22 and the ground voltage VSS2. The power supply voltage VDD22 is supplied from the regulator 39, and the ground voltage VSS2 may be supplied, for example, from the outside of the transmitter 10. The signals DN[0] to DN[63] each make a transition between the power supply voltage VDD22 and the ground voltage VSS2.

The driver 54 sets the voltage of the output terminal ToutA on the basis of the signals UP[0] to UP[63] and DN[0] to DN[63]. The driver 54 may include transistors MU[0] to MU[63] and MD[0] to MD[63]. The transistors MU[0] to MU[63] and MD[0] to MD[63] are each an N-channel MOS FET. A drain of the transistor MU[0] is supplied with the power supply voltage VDD1, a gate thereof is supplied with the signal UP[0], and a source thereof is coupled to the output terminal ToutA. A drain of the transistor MU[1] is supplied with the power supply voltage VDD1, a gate thereof is supplied with the signal UP[1], and a source thereof is coupled to the output terminal ToutA. A drain of the transistor MU[2] is supplied with the power supply voltage VDD1, a gate thereof is supplied with the UP[2], and a source thereof is coupled to the output terminal ToutA. The transistors MU[3] to MU[63] are also similarly configured. It may be possible to supply a back gate of each of the transistors MU[0] to MU[63] with, for example, a ground voltage VSS1. It is to be noted that, without being limited to this, the back gate of each of the transistors MU[0] to MU[63] may be supplied with, for example, the power supply voltage VDD1, or may be supplied with, for example, any voltage equal to or higher than the ground voltage VSS1 and equal to or lower than the power supply voltage VDD1. Further, the back gate may be coupled to, for example, the source of the transistor. A drain of the transistor MD[0] is coupled to the output terminal ToutA, a gate thereof is supplied with the signal DN[0], and a source thereof is supplied with the ground voltage VSS1. A drain of the transistor MD[1] is coupled to the output terminal ToutA, a gate thereof is supplied with the signal DN[1], and a source thereof is supplied with the ground voltage VSS1. A drain of the transistor MD[2] is coupled to the output terminal ToutA, a gate thereof is supplied with the signal DN[2], and a source thereof is supplied with the ground voltage VSS1. The transistors MD[3] to MD[63] are also similarly configured. It may be possible to supply a back gate of each of the transistors MD[0] to MD[63] with, for example, the ground voltage VSS1. It is to be noted that, without being limited to this, the back gate of each of the transistors MD[0] to MD[63] may be supplied with, for example, any voltage equal to or higher than the ground voltage VSS1 and equal to or lower than the power supply voltage VDD1. The power supply voltage VDD1 is supplied from the regulator 39, and the ground voltage VSS1 may be supplied, for example, from the outside of the transmitter 10. In the transmitter 10, this ground voltage VSS1 is supplied through wiring laid out in such a manner that a resistance value becomes sufficiently small. In the following, the term the "transistor MU" will be used where appropriate to refer to any one of the transistors MU[0] to MU[63], and likewise, the term the "transistor MD" will be used where appropriate to refer to any one of the transistors MD[0] to MD[63].

Due to this configuration, the output section 41 sets the voltage of the output terminal ToutA at one of the three voltages (the high-level voltage VH, the intermediate-level voltage VM, and the low-level voltage VL) on the basis of the signal S31. Specifically, in a case where the output terminal ToutA is to be set at the high-level voltage VH, the output controller 51 may set, for example, some (for example, the N-number) of the signals UPN[0] to UPN[63] to a low level while setting the rest to a high level, and set all the signals DNN[0] to DNN[63] to a high level. Therefore, in the driver 54, of the transistors MU[0] to MU[63], the N-number of transistors MU corresponding to the N-number of signals UPN at the low level are brought into an ON state. The output terminal ToutA is thereby set at the high-level voltage VH. Alternatively, in a case where the output terminal ToutA is to be set at the low-level voltage VL, the output controller 51 may set, for example, some (for example, the N-number) of the signals DNN[0] to DNN[63] to a low level while setting the rest to a high level, and set all the signals UPN[0] to UPN[63] to a high level. Thus, in the driver 54, of the transistors MD[0] to MD[63], the N-number of transistors MD corresponding to the N-number of signals DNN at the low level are brought into an ON state. The output terminal ToutA is thereby set at the low-level voltage VL. Alternatively, in a case where the output terminal ToutA is to be set at the intermediate-level voltage VM, the output controller 51 may set, for example, some (the N/2 number) of the signals UPN[0] to UPN[63] to a low level while setting the rest to a high level, and set some (the N/2 number) of the signals DNN[0] to DNN[63] to a low level while setting the rest to a high level. Thus, in the driver 54, of the transistors MU[0] to MU[63], the N/2 number of transistors MU corresponding to the N/2 number of signals UPN at the low level are brought into an ON state, and of the transistors MD[0] to MD[63], the N/2 number of transistors MD corresponding to the N/2 number of signals DNN at the low level are brought into an ON state. Accordingly, in the driver 54, the N/2 number of transistors MU and the N/2 number of transistors MD are brought into the ON state, thereby achieving Thevenin termination, and setting the output terminal ToutA at the intermediate-level voltage VM.

Further, the output section 41 also has a function of changing the number N of the transistors to be brought into the ON state among the transistors MU[0] to MU[63] and MD[0] to MD[63] on the basis of the control signal ZCTL. Therefore, in the output section 41, even if characteristics of each element in the driver 54 vary at the time of production, it is possible to adjust output impedance of the driver 54 to thereby match the output impedance of the driver 54 to the characteristic impedance (in this example, 50[Ω]) of the transmission lines 101A to 101C and 102A to 102C. Therefore, in the transmitter 10, for example, it may be possible to decrease the possibility that a waveform may be distracted by reflection and the like, and to enhance the communication performance.

The impedance setting section 38 sets the output impedance of the output sections 41 to 43, through the control signal ZCTL. The output impedance of the output sections 41 to 43 may be adjusted, for example, before shipment of the transmitter 10, and setting after the adjustment is stored in this impedance setting section 38. It is to be noted that this is not limitative, and, for example, a calibration circuit may be provided in the transmitter 10, and this calibration circuit may adjust the output impedance of the output sections 41 to 43.

The regulator 39 generates the power supply voltages VDD21, VDD22, and VDD1 on the basis of a power supply voltage VDD3 supplied from the outside of the transmitter 10.

FIG. 4 illustrates a configuration example of the regulator 39. The regulator 39 may include a constant current source 61, variable resistors 62 and 63, a resistor 64, and amplifiers 65 to 67. The constant current source 61 generates a predetermined current Iref, and one end thereof is supplied with the power supply voltage VDD3, while the other end thereof is coupled to one end of the variable resistor 62 and the amplifier 65. The variable resistor 62 has a variable resistance value, and one end thereof is coupled to the other end of the constant current source 61 and the amplifier 65, while the other end thereof is coupled to one end of the variable resistor 63 and the amplifier 66. The variable resistor 63 also has a variable resistance value as with the variable resistor 62, and one end thereof is coupled to the other end of the variable resistor 62 and the amplifier 66, and the other end thereof is coupled to one end of the resistor 64 and the amplifier 67. The resistance values of the respective variable resistors 62 and 63 may be adjusted, for example, before the shipment of the transmitter 10. It is to be noted that this is not limitative, and, for example, a calibration circuit may be provided in the transmitter 10, and this calibration circuit may adjust the resistance values of the respective variable resistors 62 and 63. The one end of the resistor 64 is coupled to the other end of the variable resistor 63 and the amplifier 67, and the other end thereof is supplied with a ground voltage VSS3. The ground voltage VSS3 may be supplied, for example, from the outside of the transmitter 10, and supplied through wiring laid out in such a manner that the resistance value becomes sufficiently small, in the transmitter 10. The amplifier 65 generates the power supply voltage VDD21 on the basis of the voltage of the one end of the variable resistor 62, and the like. In this example, the amplifier 65 is configured using an operational amplifier, and a positive input terminal thereof is coupled to the one end of the variable resistor 62 and the like, while a negative input terminal thereof is coupled to an output terminal. In other words, the amplifier 65 serves as a so-called voltage follower. The amplifier 66 generates the power supply voltage VDD22 on the basis of the voltage of the one end of the variable resistor 63 and the like. In this example, the amplifier 66 is configured using an operational amplifier as with the amplifier 65, and a positive input terminal thereof is coupled to the one end of the variable resistor 63 and the like, while a negative input terminal thereof is coupled to an output terminal. The amplifier 67 generates the power supply voltage VDD1 on the basis of the voltage of the one end of the resistor 64 and the like. In this example, the amplifier 67 is configured using an operational amplifier as with the amplifiers 65 and 66, and a positive input terminal thereof is coupled to the one end of the resistor 64 and the like, while a negative input terminal thereof is coupled to an output terminal.

Due to this configuration, the regulator 39 generates the power supply voltage VDD1, the power supply voltage VDD22 higher than the power supply voltage VDD 1, and the power supply voltage VDD21 higher than the power supply voltage VDD22. Further, in the regulator 39, the power supply voltage VDD21 and the power supply voltage VDD1 are allowed to have a positive correlation with each other, and the power supply voltage VDD22 and the power supply voltage VDD 1 are allowed to have a positive correlation with each other. In other words, for example, the power supply voltages VDD1, VDD21, and VDD22 may all become high when the resistance value of the resistor 64 becomes a large value by varying at the time of production, and the power supply voltages VDD1, VDD21, and VDD22 may all become small when the resistance value of the resistor 64 becomes a small value by varying at the time of production. Similarly, for example, the power supply voltages VDD1, VDD21, and VDD22 may all become high when the current Iref becomes large by varying at the time of production, and the power supply voltages VDD1, VDD21, and VDD22 may all become small when the current Iref becomes a small value. Further, for example, the power supply voltages VDD1, VDD21, and VDD22 may all become high when the current Iref becomes large according to the power supply voltage VDD3, a temperature, etc., and the power supply voltages VDD1, VDD21, and VDD22 may all become small when the current Iref becomes a small value according to the power supply voltage VDD3, a temperature, etc. In this way, the power supply voltage VDD21 and the power supply voltage VDD1 have the positive correlation with each other, and the power supply voltage VDD22 and the power supply voltage VDD 1 have the positive correlation with each other.

A reception section 71 receives the signals SIG1A, SIG1B, and SIG1C, and a reception section 72 receives the signals SIG2A, SIG2B, and SIG2C.

FIG. 5 illustrates a configuration example of the reception section 71. It is to be noted that the reception section 72 is also similarly configured. The reception section 71 may include resistors 81 to 83, amplifiers 84 to 86, a clock generator 87, a decoder 88, and serializers 91 to 93.

The resistors 81 to 83 each serve as a termination resistance of the communication system 1, and a resistance value thereof may be about 50[Ω], in this example. One end of the resistor 81 is coupled to an input terminal TinA and the like and supplied with the signal SIG1A is supplied, and the other end thereof is coupled to the other end of each of the resistors 82 and 83. One end of the resistor 82 is coupled to an input terminal TinB and the like and supplied with the signal SIG1B, and the other end thereof is coupled to the other end of each of the resistors 81 and 83. One end of the resistor 83 is coupled to an input terminal TinC and supplied with the signal SIG1C, and the other end thereof is coupled to the other end of each of the resistors 81 and 82.

The amplifiers 84, 85, and 86 each output a signal corresponding to a difference between a signal at a positive input terminal and a signal at a negative input terminal. The positive input terminal of the amplifier 84 is coupled to the negative input terminal of the amplifier 86, the one end of the resistor 81, and the input terminal TinA, and supplied with the signal SIG1A, whereas the negative input terminal thereof is coupled to the positive input terminal of the amplifier 85, the one end of the resistor 82, and the input terminal TinB, and supplied with the signal SIG1B. The positive input terminal of the amplifier 85 is coupled to the negative input terminal of the amplifier 84, the one end of the resistor 82, and the input terminal TinB, and supplied with the signal SIG1B, whereas the negative input terminal thereof is coupled to the positive input terminal of the amplifier 86, the one end of the resistor 83, and the input terminal TinC, and supplied with the signal SIG1C. The positive input terminal of the amplifier 86 is coupled to the negative input terminal of the amplifier 85, the one end of the resistor 83, and the input terminal TinC, and supplied with the signal SIG1C, whereas the negative input terminal thereof is coupled to the positive input terminal of the amplifier 84, the one end of the resistor 81, and the input terminal TinA, and supplied with the signal SIG1A.

Due to this configuration, the amplifier 84 outputs a signal corresponding to a difference between the signal SIG1A and the signal SIG1B, and the amplifier 85 outputs a signal corresponding to a difference between the signal SIG1B and the signal SIG1C, and the amplifier 86 outputs a signal corresponding to a difference between the signal SIG1C and the signal SIG1A.

FIG. 6 illustrates an operation example of the amplifiers 84, 85, and 86. In this example, the signal SIG1A is the high-level voltage VH, the signal SIG1B is the low-level voltage VL, and the signal SIG1C is the intermediate-level voltage VM. In this case, a current Iin flows through the input terminal TinA, the resistor 81, the resistor 82, and the input terminal TinB in order. Further, the positive input terminal of the amplifier 84 is supplied with the high-level voltage VH, while the negative input terminal thereof is supplied with the low-level voltage VL, and the difference is positive. Therefore, the amplifier 84 outputs "1". Further, the positive input terminal of the amplifier 85 is supplied with the low-level voltage VL, while the negative input terminal thereof is supplied with the intermediate-level voltage VM, and the difference is negative. Therefore, the amplifier 85 outputs "0". Further, the positive input terminal of the amplifier 86 is supplied with the intermediate-level voltage VM, while the negative input terminal thereof is supplied with the high-level voltage VH, and the difference is negative. Therefore, the amplifier 86 outputs "0".

Here, the pre-driver 52 corresponds to a specific example of a "first pre-driver" in the disclosure. The pre-driver 53 corresponds to a specific example of a "second pre-driver" in the disclosure. The regulator 39 corresponds to a specific example of a "power-supply-voltage generator" in the disclosure. The power supply voltage VDD1 corresponds to a specific example of a "first power supply voltage" in the disclosure. The power supply voltage VDD21 corresponds to a specific example of a "second power supply voltage" in the disclosure. The power supply voltage VDD22 corresponds to a specific example of a "third power supply voltage" in the disclosure. The output controller 51 corresponds to a specific example of a "controller" in the disclosure.

[Operation and Workings]

Next, operation and workings of the communication system 1 of the present embodiment will be described.

(Outline of Overall Operation)

First, an outline of overall operation of the communication system 1 will be described with reference to FIG. 1 and the like. In the transmitter 10, the transmission-data generator 19 generates transmission data, divides the transmission data into two pieces, and supplies the two pieces of the transmission data to the respective transmission sections 11 and 12. The transmission section 11 transmits the signals SIG1A, SIG1B, and SIG1C to the reception section 71, and the transmission section 12 transmits the signals SIG2A, SIG2B, and SIG2C to the reception section 72. For example, in the transmission section 11, the serializer 21 may convert the parallel signal TxDATA1 into a serial signal on the basis of the clock signal CLK1, the serializer 22 may convert the parallel signal TxDATA2 into a serial signal on the basis of the clock signal CLK1, and the serializer 23 may convert the parallel signal TxDATA3 into a serial signal on the basis of the clock signal CLK1. On the basis of the signals supplied from the serializers 21, 22, and 23 and the clock signal CLK2, the encoder 31 performs predetermined encoding, thereby generating the signals S31, S32, and S33. The output section 41 generates the signal SIG1A on the basis of the signal S31, the output section 42 generates the signal SIG1B on the basis of the signal S32, and the output section 43 generates the signal SIG1C on the basis of the signal S33. The regulator 39 generates the power supply voltages VDD21, VDD22, and VDD1 on the basis of the power supply voltage VDD3, and supplies these power supply voltages to the output sections 41 to 43. In the receiver 70, the reception section 71 receives the signals SIG1A, SIG1B, and SIG1C, and the reception section 72 receives the signals SIG2A, SIG2B, and SIG2C.

(Detailed Operation of Output Sections 41 to 43)

For example, in the output section 41, the output controller 51 may generate the signals UPN[0] to UPN[63] and DNN[0] to DNN[63] on the basis of the signal S31 and the control signal ZCTL. The pre-driver 52 generates the signals UP[0] to UP[63] on the basis of the signals UPN[0] to UPN[63]. The pre-driver 53 generates the signals DN[0] to DN[63] on the basis of the signals DNN[0] to DNN[63]. The driver 54 sets the voltage of the output terminal ToutA on the basis of the signals UP[0] to UP[63] and DN[0] to DN[63].

The regulator 39 generates the power supply voltage VDD21 and supplies the pre-driver 52 with the generated power supply voltage VDD21, generates the power supply voltage VDD22 and supplies the pre-driver 53 with the generated power supply voltage VDD22, and generates the power supply voltage VDD1 and supplies the driver 54 with the generated power supply voltage VDD1. At the time, the regulator 39 generates the power supply voltages VDD21, VDD22, and VDD1 in such a manner that the power supply voltage VDD21 and the power supply voltage VDD1 have the positive correlation with each other, and the power supply voltage VDD22 and the power supply voltage VDD1 have the positive correlation with each other.

FIG. 7 illustrates a voltage of each node in the output section 41, when the power supply voltages VDD21, VDD22, and VDD1 are all high. It is to be noted that, in this diagram, only the inverter IU[0] of the pre-driver 52, the inverter ID[0] of the pre-driver 53, and the transistors MU[0] and MD[0] of the driver 54 are illustrated for convenience of the description. In this example, the power supply voltage VDD21 is higher than a voltage V21 in normal times by a voltage $\Delta$V21 (VDD21=V2+$\Delta$V21), and the power supply voltage VDD22 is higher than a voltage V22 in normal times by a voltage $\Delta$V22 (VDD22=V22+$\Delta$V22), and the power supply voltage VDD1 is higher than a voltage V1 in normal times by a voltage $\Delta$V1 (VDD1=V1+$\Delta$V1).

When the output controller 51 outputs the signal UPN[0] at the low level and outputs the signal DNN[0] at the high level, the signal UP[0] is at the high level, and the signal DN[0] is at the low level, as illustrated in FIG. 7. In this case, the voltage of the signal UP[0] is V21+$\Delta$V21, and the voltage of the signal DN[0] is VSS2. Therefore, the drain of the transistor MU[0] is supplied with the voltage (V1+$\Delta$V1), and the gate thereof is supplied with the voltage (V21+$\Delta$V21). In other words, in this case, the drain voltage, the gate voltage, and the source voltage of the transistor MU[0] are all higher than those in normal times. At the time, variation in a gate-source voltage Vgs of the transistor MU[0] is not significant. This makes it possible to suppress a deviation of the output impedance of this transistor MU[0]. In this example, the transistor MU[0] has been described, but this is similarly applicable to the other transistors MU being in the ON state. Therefore, it is possible to suppress variations in the output impedance of the driver 54.

FIG. 8 illustrates a voltage of each node in the output section 41, when the power supply voltages VDD21, VDD22, and VDD1 are all low. In this example, the power supply voltage VDD21 is lower than the voltage V21 in normal times by the voltage $\Delta$V21 (VDD21=V21−$\Delta$V21), the power supply voltage VDD22 is lower than the voltage V22 in normal times by the voltage $\Delta$V22 (VDD22=V22−$\Delta$V22), and the power supply voltage VDD1 is lower than the voltage V1 in normal times by the voltage $\Delta$V1 (VDD1=V1−$\Delta$V1).

When the signal UP[0] is at the high level, and the signal DN[0] is at the low level, the voltage of the signal UP[0] is V21−$\Delta$V21, and the voltage of the signal DN[0] is VSS2. Therefore, the drain of the transistor MU[0] is supplied with the voltage (V1−$\Delta$V1), and the gate thereof is supplied with the voltage (V21−$\Delta$V21). In other words, in this case, the drain voltage, the gate voltage, and the source voltage of the transistor MU[0] are all lower than those in normal times. At the time, variation in the gate-source voltage Vgs of the transistor MU[0] is not significant. This makes it possible to suppress a deviation of the output impedance of the transistor MU[0]. As a result, it is possible to suppress variations in the output impedance of the driver 54.

Next, an example of a case where the power supply voltages VDD21 and VDD22 are high and the power supply voltage VDD1 is low will be described as a comparative example.

FIG. 9 illustrates an example of a case where the power supply voltages VDD21 and VDD22 are high and the power supply voltage VDD1 is low. In this example, the power supply voltage VDD21 is higher than the voltage V21 in normal times by the voltage $\Delta V21$ (VDD21=V21+$\Delta V21$), the power supply voltage VDD22 is higher than the voltage V22 in normal times by the voltage $\Delta V22$ (VDD22=V22+$\Delta V22$), and the power supply voltage VDD1 is lower than the voltage V1 in normal times by the voltage $\Delta V1$ (VDD1=V1-$\Delta V1$).

When the signal UP[0] is at the high level, and the signal DN[0] is at the low level, the voltage of the signal UP[0] is V21+$\Delta V21$, and the voltage of the signal DN[0] is VSS2. Therefore, the drain of the transistor MU[0] is supplied with the voltage (V1-$\Delta V1$), and the gate thereof is supplied with the voltage (V21+$\Delta V21$). In other words, in this case, the drain voltage of the transistor MU[0] is low, whereas the gate voltage thereof is high. In this case, the gate-source voltage Vgs of the transistor MU[0] is low, and the output impedance of this transistor MU[0] is large. As a result, a deviation of the output impedance of the driver 54 may be large.

In this way, in this comparative example, when the power supply voltages VDD21 and VDD22 are high, and the power supply voltage VDD1 is low, the output impedance of the driver 54 is large. For example, when such a deviation of the output impedance is adjusted by changing the number N of transistors to be brought into the ON state among the transistors MU[0] to MU[63] and MD[0] to MD[63], this adjustment may not be sufficient due to an insufficient adjustment range. In that case, waveforms of the signals SIG1A to SIG1C and the signals SIG2A to SIG2C are disturbed, which may degrade the communication performance.

In contrast, in the present embodiment, since the power supply voltage VDD21 and the power supply voltage VDD1 have the positive correlation with each other, and the power supply voltage VDD22 and the power supply voltage VDD 1 have the positive correlation with each other, it is possible to reduce the possibility that the output impedance of the driver 54 may vary due to variations in the characteristics of each element in the regulator 39. Therefore, in the communication system 1, it is possible to enhance the communication performance.

Further, in the output section 41, the power supply voltage VDD21 of the pre-driver 52 that drives the transistor MU and the power supply voltage VDD22 of the pre-driver 53 that drives the transistor MD are different from each other. Furthermore, in the regulator 39, the variable resistors 62 and 63 are provided to make it possible to adjust these power supply voltages VDD21 and VDD22. This makes it possible to adjust the gate-source voltage Vgs of each of the transistors MU and MD of the driver 54, and to adjust the output impedance of the driver 54. As a result, in the communication system 1, it is possible to enhance the communication performance.

Further, in the transmitter 10, a plurality of ways of adjusting the output impedance of the driver 54 are provided. In other words, in the driver 54, it is possible to change the number N of the transistors to be brought into the ON state among the transistors MU[0] to MU[63] and MD[0] to MD[63], and in the regulator 39, it is possible to adjust the power supply voltages VDD21 and VDD22. This makes it possible to increase flexibility in adjusting the output impedance of the driver 54. As a result, in the communication system 1, it is possible to implement more appropriate impedance matching, and to enhance the communication performance.

[Effects] In the present embodiment, as described above, the power supply voltage VDD21 and the power supply voltage VDD 1 have the positive correlation with each other, and the power supply voltage VDD22 and the power supply voltage VDD1 have the positive correlation with each other. Therefore it is possible to enhance the communication performance.

In the present embodiment, the power supply voltage VDD21 of the pre-driver 52 and the power supply voltage VDD22 of the pre-driver 53 that drives the transistor MD are different from each other, and also adjustment of these power supply voltages VDD21 and VDD22 is allowed. Therefore, it is possible to enhance the communication performance.

[Modification 1] In the above-described embodiment, upon setting the output terminal ToutA or the like at the intermediate-level voltage VM, Thevenin termination is achieved in the driver 54. However, this is not limitative. For example, alternatively, a high impedance state may be achieved in the driver 54. Specifically, in a case where the output terminal ToutA is to be set at the intermediate-level voltage VM, the output controller 51 may set, for example, all the signals UPN[0] to UPN[63] and DNN[0] to DNN[63] to the high level. Thus, in the driver 54, all of the transistors MU[0] to MU[63] and MD[0] to MD[63] are brought into the OFF state, and the output impedance becomes high impedance. At this time, one of the output terminals ToutB and ToutC is set at the high-level voltage VH, and the other is set at the low-level voltage VL. Therefore, the voltage of the output terminal ToutA is set at the intermediate-level voltage VM, through the resistors 81 to 83 of the reception section 71 or the like. Providing such a configuration also makes it possible to achieve effects similar to the effects of the communication system 1 according to the above-described embodiment.

[Modification 2] In the above-described embodiment, the impedance setting section 38 supplies the control signal ZCTL to the three output sections 41 to 43, but this is not limitative. Alternatively, for example, as in a transmission section 11B illustrated in FIG. 10, an impedance setting section 38B may supply a control signal ZCTL1 to the output section 41, supply a control signal ZCTL2 to the output section 42, and supply the control signal ZCTL3 to the output section 43. By providing such a configuration, it may be possible to perform, for example, impedance setting different for each of the output sections 41 to 43.

[Modification 3] In the above-described embodiment, exchange of data is performed using the three voltages (the high-level voltage VH, the intermediate-level voltage VM, and the low-level voltage VL). However, this is not limitative. Alternatively, for example, exchange of data may be performed using four or more voltages, or exchange of data may be performed using two voltages. A case where exchange of data is performed using two voltages (the high-level voltage VH and the low-level voltage VL) will be described below in detail.

FIG. 11 illustrates a configuration example of a communication system 2 according to the present modification. A transmitter 110 may include a transmission-data generator 119 and a transmission section 111. The transmission-data generator 119 generates transmission data and supplies the generated transmission data to the transmission section 111. The transmission section 111 transmits the data to a reception section 171 of a receiving unit 170 using signals SIGA and SIGB. The signals SIGA and SIGB configure a differential signal. Characteristic impedance of transmission lines 103A and 103B through which these signals are transmitted is about 50[Ω], in this example.

FIG. 12 illustrates a configuration example of the transmission section 111. The transmission section 111 has a serializer 121 and an output section 141. The serializer 121 converts a parallel signal TxDATA into a serial signal on the basis of the clock signal CLK1, thereby generating a signal S121. The output section 141 generates the signals SIGA and SIGB on the basis of the signal S121.

FIG. 13 illustrates a configuration example of the output section 141. The output section 141 may include an output controller 151, pre-driver sections 152 and 153, and a driver 154.

The output controller 151 generates signals SA[0] to SA[63] and SB[0] to SB[63] on the basis of the signal S121 and the control signal ZCTL. In the following, the term the "signal SA" will be used where appropriate to refer to any one of the signals SA[0] to SA[63], and likewise, the term the "signal SB" will be used where appropriate to refer to any one of the signals SB[0] to SB[63].

The pre-driver 152 generates signals UPA[0] to UPA[63] and UPB[0] to UPB[63] on the basis of the signals SA[0] to SA[63] and SB[0] to SB[63]. This pre-driver 152 may include inverters IUA[0] to IUA[63] and IUB[0] to IUB[63]. The inverter IUA[0] inverts the signal SA[0], thereby generating the signal UPA[0]. The inverters IUA[1] to IUA[63] operate similarly. The inverter IUB[0] inverts the signal SB[0], thereby generating the signal UPB[0]. The inverters IUB[1] to IUB[63] operate similarly. The pre-driver 152 is supplied with the power supply voltage VDD21 and the ground voltage VSS2.

The pre-driver 153 generates signals DNA[0] to DNA[63] and DNB[0] to DNB[63] on the basis of the signals SA[0] to SA[63] and SB[0] to SB[63]. This pre-driver 153 may include inverters IDA[0] to IDA[63] and IDB[0] to IDB[63]. The inverter IDA[0] inverts the signal SB[0], thereby generating the signal DNA[0]. The inverters IDA[1] to IDA[63] operate similarly. The inverter IDB[0] inverts the signal SA[0], thereby generating the signal DNB[0]. The inverters IDB[1] to IDB[63] operate similarly. The pre-driver 153 is supplied with the power supply voltage VDD22 and the ground voltage VSS2.

The driver 154 sets the voltage of the output terminal ToutA on the basis of the signals UPA[0] to UPA[63] and DNA[0] to DNA[63], and sets the voltage of the output terminal ToutB on the basis of the signals UPB[0] to UPB[63] and DNB[0] to DNB[63]. The driver 154 may include transistors MUA[0] to MUA[63], MUB[0] to MUB[63], MDA[0] to MDA[63], and MDB[0] to MDB[63]. A drain of the transistor MUA[0] is supplied with the power supply voltage VDD1, a gate thereof is supplied with the signal UPA[0], and a source thereof is coupled to the output terminal ToutA. The transistors MUA[1] to MUA[63] are also similarly configured. A drain of the transistor MDA[0] is coupled to the output terminal ToutA, a gate thereof is supplied with the signal DNA[0], and a source thereof is supplied with the ground voltage VSS1. The transistors MDA[1] to MDA[63] are also similarly configured. A drain of transistor MUB[0] is supplied with the power supply voltage VDD1, a gate thereof is supplied with the signal UPB[0], and a source thereof is coupled to the output terminal ToutB. The transistors MUB[1] to MUB[63] are also similarly configured. A drain of the transistor MDB[0] is coupled to the output terminal ToutB, a gate thereof is supplied with the signal DNB[0], and a source thereof is supplied with the ground voltage VSS1. The transistors MDB[1] to MDB[63] are also similarly configured. In the following, the term the "transistor MUA" will be used where appropriate to refer to any one of the transistors MUA[0] to MUA[63], and the term the "transistor MDA" will be used where appropriate to refer to any one of the transistors MDA[0] to MDA[63]. Similarly, the term the "transistor MUB" will be used where appropriate to refer to any one of the transistors MUB[0] to MUB[63], and the term the "transistor MDB" will be used where appropriate to refer to any one of the transistors MDB[0] to MDB[63].

Due to this configuration, the output section 141 sets the respective voltages of the output terminals ToutA and ToutB on the basis of the signal S121. Specifically, in a case where the output terminal ToutA is to be set at the high-level voltage VH, and the output terminal ToutB is to be set at the low-level voltage VL, the output controller 151 may, for example, set some (for example, the N-number) of the signals SA[0] to SA[63] to a low level while setting the rest to a high level, and set all of the signals SB[0] to SB[63] to a high level. Thus, in the driver 154, the N-number of transistors MUA corresponding to the N-number of signals SA at the low level among the transistors MUA[0] to MUA[63] are brought into an ON state, and the N-number of transistors MDB corresponding to the N-number of signals SA at the low level among the transistors MDB[0] to MDB[63] are brought into an ON state. Accordingly, the output terminal ToutA is set at the high-level voltage VH, and the output terminal ToutB is set at the low-level voltage VL. Further, in a case where the output terminal ToutA is to be set at the low-level voltage VL, and the output terminal ToutB is to be set at the high-level voltage VH, the output controller 151 may, for example, set some (for example, the N-number) of the signals SB[0] to SB[63] to a low level while setting the rest to the high level, and setting all of the signals SA[0] to SA[63] to the high level. Thus, in the driver 154, the N-number of transistors MDA corresponding to the N-number of signals SB at the low level among the transistors MDA[0] to MDA[63] are brought into an ON state, and the N-number of transistors MUB corresponding to the N-number of signals SB at the low level among the transistors MUB[0] to MUB[63] are brought into an ON state. Accordingly, the output terminal ToutA is set at the low-level voltage VL, and the output terminal ToutB is set at the high-level voltage VH.

Further, the output section 141 is allowed to change the number N of the transistors to be brought into the ON state among the transistors MUA[0] to MUA[63], MUB[0] to MUB[63], MDA[0] to MDA[63], and MDB[0] to MDB[63], on the basis of the control signal ZCTL, as with the output section 41 according to the above-described embodiment.

Providing such a configuration also makes it possible to achieve effects similar to the effect of the communication system 1 according to the above-described embodiment.

[Other Modifications] Further, two or more of these modifications may be combined.

<2. Application Example> Next, an application example of the transmitter described in any one of the above-described embodiment and modifications will be described.

FIG. 14 illustrates an appearance of a smartphone 700 (a multifunctional mobile phone) to which the transmitter of any of the above-described embodiment and the like is applied. This smartphone 700 may be equipped with various devices. In a communication system exchanging data between those devices, the transmitter of any of the above-described embodiment and the like is applied.

FIG. 15 illustrates a configuration example of an application processor 710 used for the smartphone 700. The application processor 710 may include a CPU (Central Processing Unit) 711, a memory controller 712, a power-supply controller 713, an external interface 714, a GPU (Graphics Processing Unit) 715, a media processing section 716, a display controller 717, and an MIPI (Mobile Industry Processor Interface) interface 718. In this example, the CPU 711, the memory controller 712, the power-supply controller 713, the external interface 714, the GPU 715, the media processing section 716, and the display controller 717 are coupled to a system bus 719 and allowed to exchange data with each other through this system bus 719.

The CPU 711 processes various kinds of information handled in the smartphone 700, according to a program. The memory controller 712 controls a memory 901 to be used when the CPU 711 performs information processing. The power-supply controller 713 controls a power supply of the smartphone 700.

The external interface 714 is an interface for communication with an external device, and is coupled to a wireless communication section 902 and an image sensor 810, in this example. The wireless communication section 902 wirelessly communicates with a base station of mobile phones, and may include, for example, a baseband section and an RF (Radio Frequency) front end section. The image sensor 810 acquires an image, and may include, for example, a CMOS sensor.

The GPU 715 performs image processing. The media processing section 716 processes information such as sound, text, and graphics. The display controller 717 controls a display 904, through the MIPI interface 718. The MIPI interface 718 transmits an image signal to the display 904. For the image signal, it may be possible to use, for example, a signal in form such as YUV form and RGB form. For example, the transmitter of any one of the above-described embodiment and the like may be applied to this MIPI interface 718.

FIG. 16 illustrates a configuration example of the image sensor 810. The image sensor 810 may include a sensor section 811, an ISP (Image Signal Processor) 812, a JPEG (Joint Photographic Experts Group) encoder 813, a CPU 814, and a RAM (Random Access Memory) 815, a ROM (Read Only Memory) 816, a power-supply controller 817, an I²C (Inter-Integrated Circuit) interface 818, and an MIPI interface 819. In this example, these blocks are each coupled to a system bus 820, and allowed to exchange data with each other through this system bus 820.

The sensor section 811 acquires an image, and may be configured of, for example, a CMOS sensor. The ISP 812 performs predetermined processing on the image acquired by the sensor section 811. The JPEG encoder 813 encodes the image processed by the ISP 812, thereby generating a JPEG image. The CPU 814 controls each block of the image sensor 810 according to a program. The RAM 815 is a memory to be used when the CPU 814 performs information processing. The ROM 816 stores the program executed by the CPU 814. The power-supply controller 817 controls a power supply of the image sensor 810. The I²C interface 818 receives a control signal from the application processor 710. Further, although not illustrated, the image sensor 810 receives a clock signal in addition to the control signal, from the application processor 710. Specifically, the image sensor 810 is allowed to operate on the basis of clock signals having various frequencies. The MIPI interface 819 transmits an image signal to the application processor 710. For the image signal, it may be possible to use, for example, a signal in form such as YUV form and RGB form. For example, the transmitter of any one of the above-described embodiment and the like may be applied to this MIPI interface 819.

The present technology has been described above using the embodiment, the modifications, and the example of application to the electronic apparatus. However, the present technology is not limited to the foregoing embodiment and the like and is variously modifiable.

For example, in the above-described embodiment and the like, the sixty four transistors MU[0] to MU[63] and the sixty four transistors MD[0] to MD[64] are provided. However, this is not limitative. Alternatively, sixty three or less or sixty five or more transistors may be provided.

It is to be noted that the effects described herein are mere examples without being limitative, and other effects may be also provided.

It is to be noted that the technology may adopt the following configurations.

(1) A transmitter, including:
a driver including a first transistor and a second transistor, the first transistor having a drain supplied with a first power supply voltage, a source led to an output terminal, and a gate, and the second transistor having a drain led to the output terminal, a grounded source, and a gate;
a first pre-driver that is supplied with a second power supply voltage and drives the gate of the first transistor, the second power supply voltage having a positive correlation with the first power supply voltage;
a second pre-driver that is supplied with a third power supply voltage and drives the gate of the second transistor; and
a power-supply-voltage generator that generates the first power supply voltage, the second power supply voltage, and the third power supply voltage.

(2) The transmitter according to (1), further including a controller, wherein
the driver includes a plurality of first transistors each being the first transistor, and a plurality of second transistors each being the second transistor, and
the controller selects a transistor to be turned on or off from among the plurality of first transistors, and selects a transistor to be turned on or off from among the plurality of second transistors.

(3) The transmitter according to (2), wherein the first pre-driver selectively supplies one of the second power supply voltage and a ground voltage to the gate of the transistor to be turned on or off among the plurality of first transistors, and supplies the ground voltage to the gate of each of the remaining transistors, and
the second pre-driver selectively supplies one of the third power supply voltage and the ground voltage to the gate of the transistor to be turned on or off among the plurality of second transistors, and supplies the ground voltage to the gate of each of the remaining transistors.

(4) The transmitter according to any one of (1) to (3), wherein the power-supply-voltage generator is allowed to adjust the second power supply voltage and the third power supply voltage.

(5) The transmitter according to any one of (1) to (4), wherein the third power supply voltage has a positive correlation with the first power supply voltage.

(6) The transmitter according to any one of (1) to (5), wherein the first power supply voltage is lower than the second power supply voltage.

(7) The transmitter according to (6), wherein the third power supply voltage is lower than the second power supply voltage.

(8) The transmitter according to any one of (1) to (7), wherein the power-supply-voltage generator includes
a first resistor having a grounded first terminal and a second terminal coupled to a first node,
a first variable resistor having a first terminal coupled to the first node, and a second terminal coupled to a second node,
a second variable resistor having a first terminal coupled to the second node, and a second terminal coupled to a third node,
a current source coupled to the third node, and
an amplifier that generates the first power supply voltage on a basis of a voltage of the first node, generates the second power supply voltage on a basis of a voltage of the third node, and generates the third power supply voltage on a basis of a voltage of the second node.

(9) The transmitter according to (2) or (3), wherein the first pre-driver and the second pre-driver perform driving to selectively bring, into an ON state, one or both of predetermined number of transistors among the plurality of first transistors and predetermined number of transistors among the plurality of second transistors.

(10) The transmitter according to (2) or (3), wherein the first pre-driver and the second pre-driver perform driving to selectively bring, into an OFF state, one or both of predetermined number of transistors among the plurality of first transistors and predetermined number of transistors among the plurality of second transistors.

(11) The transmitter according to (2) or (3), wherein the first pre-driver and the second pre-driver perform driving to selectively bring, into an ON state, predetermined number of transistors among the plurality of first transistors or predetermined number of transistors among the plurality of second transistors.

(12) A communication system, including:
a transmitter; and
a receiver, wherein
the transmitter includes
a driver including a first transistor and a second transistor, the first transistor having a drain supplied with a first power supply voltage, a source led to an output terminal, and a gate, and the second transistor having a drain led to the output terminal, a grounded source, and a gate,
a first pre-driver that is supplied with a second power supply voltage and drives the gate of the first transistor, the second power supply voltage having a positive correlation with the first power supply voltage,
a second pre-driver that is supplied with a third power supply voltage and drives the gate of the second transistor, and
a power-supply-voltage generator that generates the first power supply voltage, the second power supply voltage, and the third power supply voltage.

(13) The communication system according to (12), wherein
the transmitter is an image sensor that acquires image data and transmits the acquired image data, and
the receiver is a processor that receives the image data, and performs predetermined processing on a basis of image information of the received image data.

The present application is based on and claims priority from Japanese Patent Application No. 2014-131605 filed in the Japan Patent Office on Jun. 26, 2014, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

The invention claimed is:

1. A transmitter, comprising:
a driver including:
a first transistors; and
a second transistor,
wherein the first transistor comprises:
a drain configured to receive a first power supply voltage;
a source led to an output terminal; and
a gate, and
wherein the second transistor comprises:
a drain led to the output terminal;
a grounded source; and
a gate;
a first pre-driver configured to:
receive a second power supply voltage; and
drive the gate of the first transistor,
wherein the second power supply voltage has a positive correlation with the first power supply voltage, and
wherein the first power supply voltage is lower than the second power supply voltage;
a second pre-driver configured to:
receive a third power supply voltage; and
drive the gate of the second transistor; and
a power-supply-voltage generator configured to generate the first power supply voltage, the second power supply voltage, and the third power supply voltage.

2. The transmitter according to claim 1, further comprising a controller, wherein
the driver further includes:
a plurality of first transistors; and
a plurality of second transistors,
wherein the plurality of first transistors includes the first transistor and the plurality of second transistors includes the second transistor, and
wherein the controller is configured to:
select the first transistor to be turned on or off from among the plurality of first transistors; and
select the second transistor to be turned on or off from among the plurality of second transistors.

3. The transmitter according to claim 2, wherein
the first pre-driver is further configured to:
selectively supply one of the second power supply voltage or a ground voltage to the gate of the first transistor to be turned on or off among the plurality of first transistors; and
supply the ground voltage to the gate of each transistor of remaining transistors among the plurality of first transistors, and the second pre-driver is further configured to:
selectively supply one of the third power supply voltage or the ground voltage to the gate of the second transistor to be turned on or off among the plurality of second transistors; and
supply the ground voltage to the gate of each transistor of remaining transistors among the plurality of second transistors.

4. The transmitter according to claim 2, wherein the first pre-driver and the second pre-driver are further configured to selectively bring, into an ON state, one or both of a first number of transistors among the plurality of first transistors or a second number of transistors among the plurality of second transistors.

5. The transmitter according to claim 2, wherein the first pre-driver and the second pre-driver are further configured to selectively bring, into an OFF state, one or both of a first number of transistors among the plurality of first transistors or a second number of transistors among the plurality of second transistors.

6. The transmitter according to claim 2, wherein the first pre-driver and the second pre-driver are further configured to selectively bring, into an ON state, a first number of transistors among the plurality of first transistors or a second number of transistors among the plurality of second transistors.

7. The transmitter according to claim 1, wherein the power-supply-voltage generator is further configured to adjust the second power supply voltage and the third power supply voltage.

8. The transmitter according to claim 1, wherein the third power supply voltage has a positive correlation with the first power supply voltage.

9. The transmitter according to claim 1, wherein the third power supply voltage is lower than the second power supply voltage.

10. The transmitter according to claim 1, wherein the power-supply-voltage generator includes:
a first resistor having a grounded first terminal and a second terminal coupled to a first node;
a first variable resistor having a first terminal coupled to the first node and a second terminal coupled to a second node;
a second variable resistor having a first terminal coupled to the second node and a second terminal coupled to a third node;
a current source coupled to the third node; and
an amplifier configured to:
generate the first power supply voltage based on a voltage of the first node;
generate the second power supply voltage based on a voltage of the third node; and
generate the third power supply voltage based on a voltage of the second node.

11. A communication system, comprising:
a transmitter; and
a receiver, wherein
the transmitter includes:
a driver, wherein the driver includes:
a first transistor; and
a second transistor,
wherein the first transistor comprises:
a drain configured to receive a first power supply voltage;
a source led to an output terminal; and
a gate, and
wherein the second transistor comprises:
a drain led to the output terminal;
a grounded source; and
a gate;
a first pre-driver configured to:
receive a second power supply voltage; and
drive the gate of the first transistor,
wherein the second power supply voltage has a positive correlation with the first power supply voltage, and
wherein the first power supply voltage is lower than the second power supply voltage;
a second pre-driver configured to:
receive a third power supply voltage; and
drive the gate of the second transistor; and
a power-supply-voltage generator configured to generate the first power supply voltage, the second power supply voltage, and the third power supply voltage.

12. The communication system according to claim 11, wherein
the transmitter is an image sensor configured to:
acquire image data; and
transmit the acquired image data, and
the receiver is a processor configured to:
receive the image data; and
execute a process based on image information of the received image data.

13. A transmitter, comprising:
a driver including:
a plurality of first transistors; and
a plurality of second transistors,
wherein each first transistor of the plurality of first transistors comprises:
a drain configured to receive a first power supply voltage;
a source led to an output terminal; and
a gate, and
wherein each second transistor of the plurality of second transistors comprises:
a drain led to the output terminal;
a grounded source; and
a gate;
a controller configured to:
select a transistor to be turned on or off from among the plurality of first transistors; and
select a transistor to be turned on or off from among the plurality of second transistors;
a first pre-driver configured to:
receive a second power supply voltage;
drive the gate of each first transistor of the plurality of first transistors;
selectively supply one of the second power supply voltage or a ground voltage to the gate of the transistor to be turned on or off among the plurality of first transistors; and
supply the ground voltage to the gate of each transistor of remaining transistors among the plurality of first transistors,
wherein the second power supply voltage has a positive correlation with the first power supply voltage;
a second pre-driver configured to:
receive a third power supply voltage;
drive the gate of each second transistor of the plurality of the second transistors;
selectively supply one of the third power supply voltage or the ground voltage to the gate of the transistor to be turned on or off among the plurality of second transistors; and
supply the ground voltage to the gate of each transistor of remaining transistors among the plurality of second transistors; and a power-supply-voltage generator configured to generate the first power supply voltage, the second power supply voltage, and the third power supply voltage.

14. A transmitter, comprising:
a driver including:
   a first transistor; and
   a second transistor,
   wherein the first transistor comprises:
      a drain configured to receive a first power supply voltage;
      a source led to an output terminal; and
      a gate, and
   wherein the second transistor comprises:
      a drain led to the output terminal;
      a grounded source; and
      a gate;
a first pre-driver configured to:
   receive a second power supply voltage; and
   drive the gate of the first transistor,
   wherein the second power supply voltage has a positive correlation with the first power supply voltage;
a second pre-driver configured to:
   receive a third power supply voltage; and
   drive the gate of the second transistor; and
a power-supply-voltage generator comprising:
   a first resistor having a grounded first terminal and a second terminal coupled to a first node;
   a first variable resistor having a first terminal coupled to the first node and a second terminal coupled to a second node;
   a second variable resistor having a first terminal coupled to the second node and a second terminal coupled to a third node;
   a current source coupled to the third node; and
   an amplifier configured to:
      generate the first power supply voltage based on a voltage of the first node;
      generate the second power supply voltage based on a voltage of the third node; and
      generate the third power supply voltage based on a voltage of the second node.

* * * * *